United States Patent [19]

Rowland et al.

[11] 3,932,883

[45] Jan. 13, 1976

[54] PHOTOCATHODES

[75] Inventors: Michael Charles Rowland, Royston; David Robert Wight, Hitchen, both of England

[73] Assignee: The British Secretary of State for Defense, London, England

[22] Filed: June 24, 1974

[21] Appl. No.: 482,700

Related U.S. Application Data

[63] Continuation of Ser. No. 278,834, Aug. 8, 1972, abandoned.

[52] U.S. Cl. ...................... 357/30; 357/16; 357/17; 357/61

[51] Int. Cl.² ............H01L 29/161; H01L 33/00; H01L 27/14; H01L 29/20

[58] Field of Search ............ 357/16, 17, 30, 61, 88, 357/89

[56] References Cited

UNITED STATES PATENTS

| | | | |
|---|---|---|---|
| 3,309,553 | 3/1967 | Kroemer | 357/17 |
| 3,322,575 | 5/1967 | Ruehrwein | 357/17 |
| 3,351,502 | 11/1967 | Rediker | 357/17 |

*Primary Examiner*—Michael J. Lynch
*Assistant Examiner*—E. Wojciechowicz
*Attorney, Agent, or Firm*—Elliott I. Pollock

[57] ABSTRACT

A transmission photocathode comprising a crystal substrate transparent to the radiation to be detected, at least one epitaxial crystalline intermediate layer having a lattice constant close to that of the detector layer and transparent to the radiation to be detected, and a p-type group III-V compound detector layer. Preferably the intermediate layer is p-type.

6 Claims, 4 Drawing Figures

PHOTOCATHODES

Figure 1:
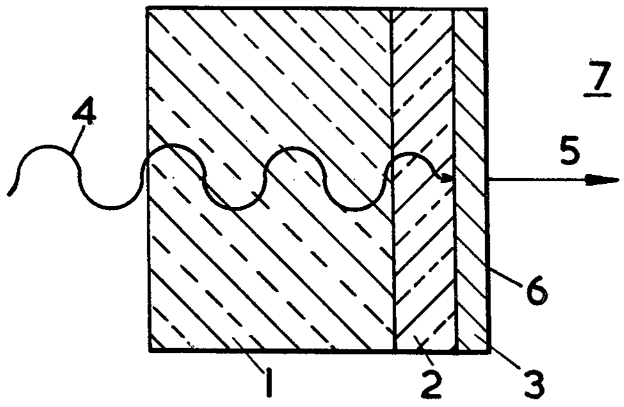

This is a continuation of application Ser. No. 278,834, filed Aug. 8, 1972, and now abandoned.

This invention relates to transmission photocathodes, more particularly to transmission photocathodes in which the detector material is a group III-V compound semi-conductor.

It is well established from both theoretical and practical aspects that considerable advantage and improvement can result from the use of III - V group compound semi-conductor photocathodes. For example, a photocathode based on gallium arsenide (GaAs) has a response to a longer wavelength and an increased sensitivity when compared to the conventional multi-alkali photocathodes.

Transmission photocathodes, in which radiation reaching one face of a thin film detector layer results in the emission of electrons from the opposite face, require that the detector layer be less than the electron diffusion length in thickness if sufficient electrons are to emerge and not be reabsorbed in the material. It is clear that such detector material will be very thin and requires support in a practical device. In a transmission photocathode, however, the supporting substrate must be transparent to the radiation to be detected and hitherto systems proposed have suffered from limitations in performance and/or production difficulties.

In British Pat. No. 1,239,893 for example it has been proposed that gallium aluminium arsenide be epitaxially grown onto a seed crystal of gallium arsenide prior to the growth of a thin p-type gallium arsenide detector layer, and that finally the gallium arsenide seed be lapped away. It is difficult to provide thick robust substrates by this process particularly of large diameter with a consistent composition throughout the layer.

P-type gallium arsenide detectors on substrate systems however, are not as efficient and sensitive as would be expected and the presence of the substrate-detector layer interface bordering or at the active region of the photocathode introduces additional difficulties in the growth of the structure which degrade the final devices.

In the present invention a transmission photocathode is characterized in that it comprises a p-type group III-V compound photocathodic detector layer, at least one epitaxial crystalline intermediate layer transparent to the radiation to be detected and having a lattice constant close to that of the detector layer, and a crystal substrate transparent to the radiation to be detected. Transmission photocathodes in accordance with the invention can be made with large diameters and can be extremely robust. They can be constructed to make use of various easily available substrates.

We have found that with provision of an intermediate layer having a lattice constant close to that of the detector layer and having a moderate thickness significantly less than that required for a satisfactory supporting substrate, a substantially improved performance can be achieved. Thus for example, the provision of an intermediate layer of $Ga_{(1-x)}Al_xAs$ of 5 – 50 $\mu$m in thickness between a p-type GaAs detector layer and a GaP substrate has greatly enhanced the performance of gallium arsenide transmission photocathodes.

It has also been found that the provision of an intermediate layer has a further advantage in that a p-type dopant can be provided in the intermediate layer, further enhancing the performance of the photocathode by raising the conduction level in the intermediate layer, so that a potential barrier is provided at the interface with the detector layer preventing the return of photoexcited electrons from the detector layer into the intermediate layer. It has been found that provision of sufficient p-type dopant in the intermediate layer to produce a potential barrier of about ½ volt at the interface effectively stops all electrons entering the intermediate layer and increases the electron yield by 50%, yet is not sufficient to cause a large increase in the radiation absorptivity of the intermediate layer. P-type doping of the intermediate layer has been found to give a further advantage in that the p-type detector layer can be more easily grown on it.

The preferred substrate is gallium phosphide, although sapphire or quartz for example might be used.

Alloys from the mixed III-V alloy system provide particularly suitable materials for epitaxial intermediate layers under p-type III-V compound detectors.

In the particular case of a p-type gallium arsenide detector layer p-type $Ga_{(1-x)}Al_xAs$ provides a particularly suitable intermediate layer as it has a lattice constant between 5.65A when X = 0 (pure gallium arsenide) and 5.66A for X = 1 (pure aluminum arsenide) compared to the lattice constant of 5.65A for gallium arsenide. In a thickness of 50$\mu$m it is possible to accommodate the lattice mismatch between a gallium phosphide substrate and p-type gallium arsenide detector layer. The intermediate layer can be controllably grown to thickness of this order without problems and without variations in the composition through the thickness. A further advantage arising from the use of gallium aluminum arsenide is derived from the variation of energy gap for increasing values of X. Thus by selecting the energy gap of the intermediate layer, one can provide the photocathode with a particular window. For most requirements a transmission photocathode with a wide window is appropriate, and for this reason X is selected such that $0.4 \leq X \leq 1$. It has been found in practice that X = 0.7 provides a convenient easily reproducible material.

P-type $Ga_{0.5}In_{0.5}P$ is also particularly suitable for the intermediate layer under p-type gallium arsenide, this alloy having a lattice constant of 5.65A.

Other combinations of detector layer and intermediate layer are possible, for example a p-type gallium indium arsenide detector layer could be used in conjunction with a p-type gallium indium phosphide intermediate layer, as could a p-type gallium arsenide antimonide detector layer. Another possible detector layer is p-type indium phosphide, although this material presents difficulties with activation as the usual caesium and oxygen activation process is inappropriate. Other possibilities include p-type indium arsenide phosphide as the detector layer.

Zinc, cadmium, germanium or silicon are suitable for providing the p-type doping in not only the detector layer but also in the intermediate layer.

The manufacturing process is characterized in that the intermediate layer is first epitaxially grown on the crystalline substrate, prior to the epitaxially deposition of the detector layer. It may further be characterised in that the process used is horizontal or vertical liquid epitaxy or vapour deposition.

In order to facilitate comprehension of the invention the following description, by way of example only, will refer to the accompanying drawings in which:

FIG. 1 shows a section through a photocathode according to invention; and

Figure 2:
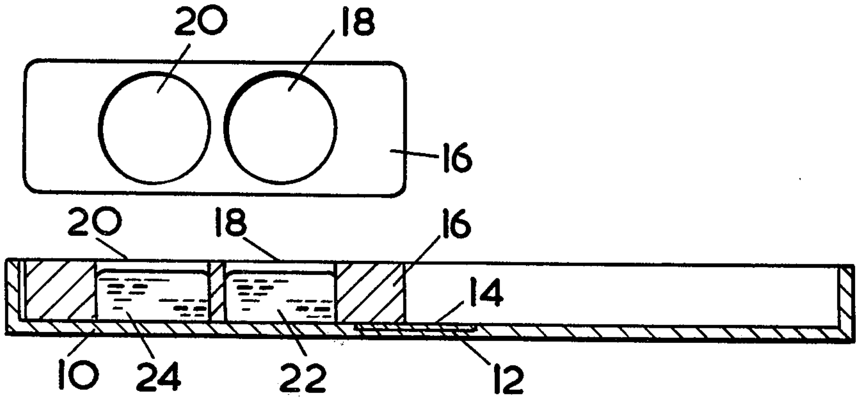
Figure 3:
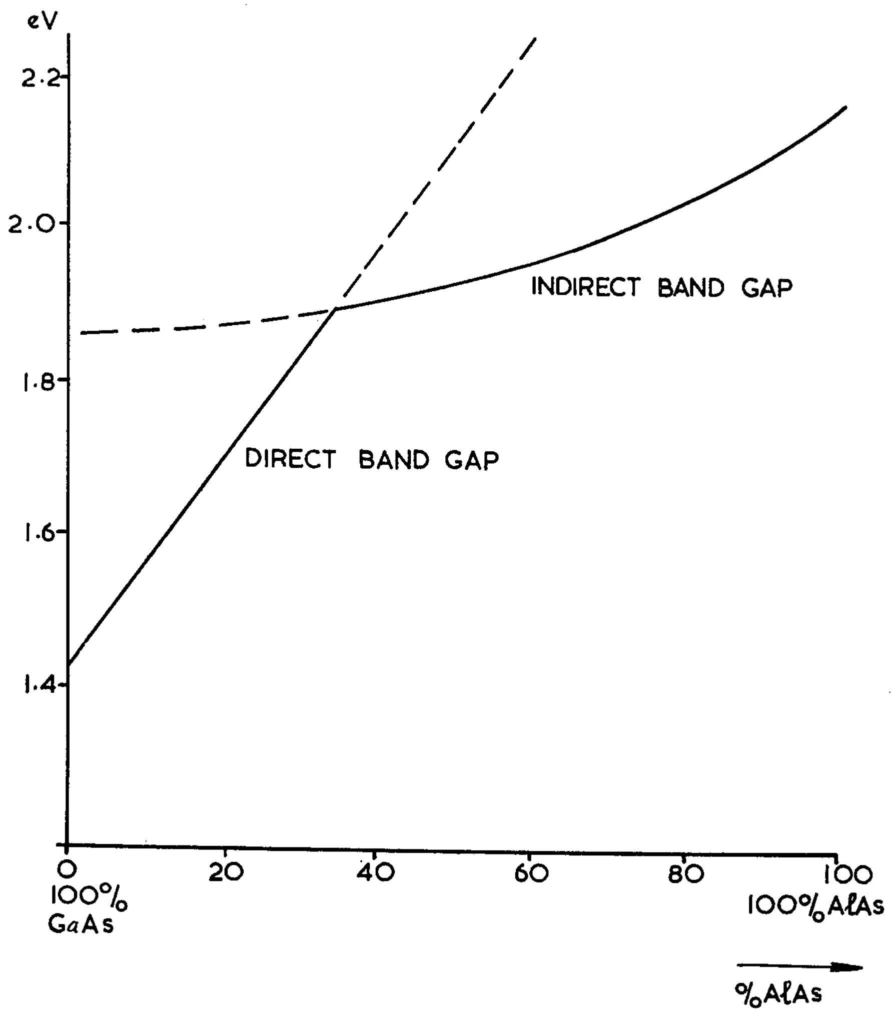
Figure 4:
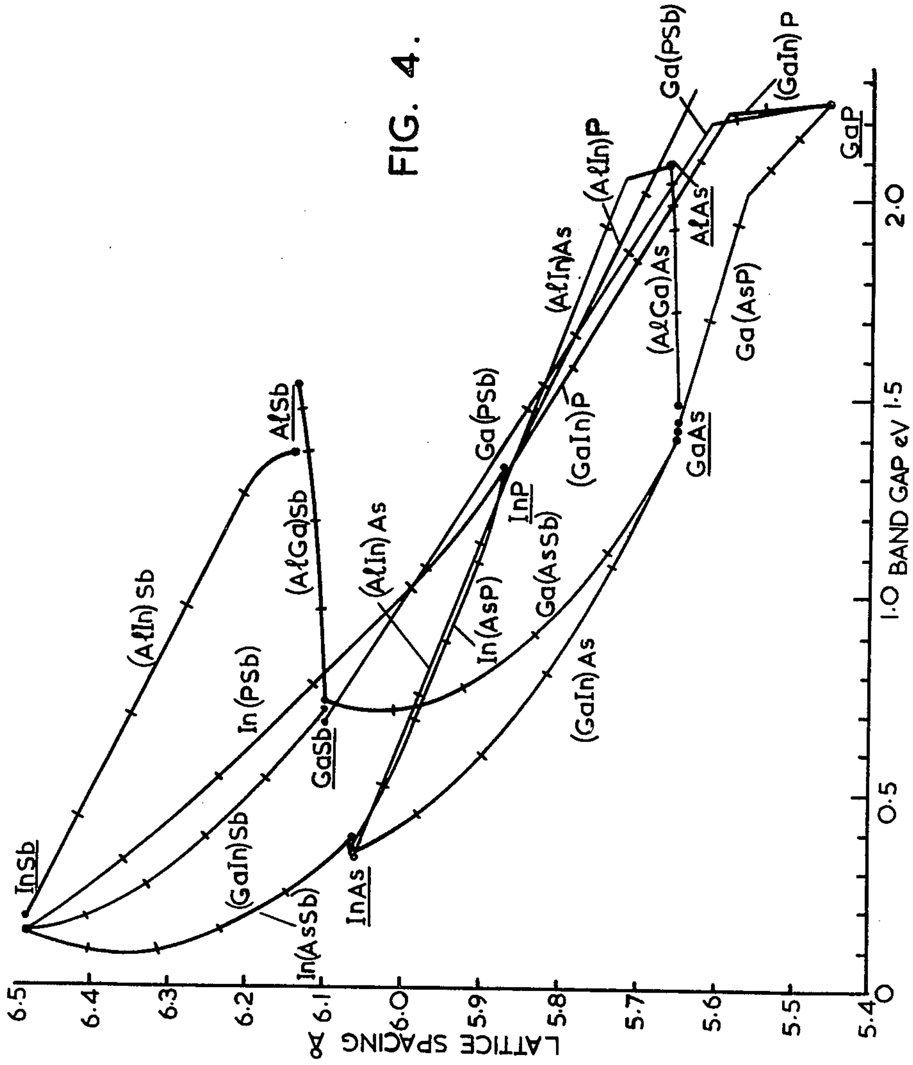

FIG. 2 a horizontal system for double liquid epitaxy suitable for use with the invention, the lower view showing the boat and sides in longitudinal section and primed for use, and the upper view showing an empty boat in isolation, FIG. 3 is a graphical representation of the variation of energy band gap with concentration of AlAs in the alloy $Ga_{(1-x)}$ $Al_xAs$; and FIG. 4 shows the relationship between energy gap and lattice spacing for mixed III-V semiconductors.

In FIG. 1, a transmission photocathode is illustrated wherein a p-type gallium arsenide detector layer 3 is supported upon a transparent crystalline gallium phosphide substrate 1. Interposed between the detector layer and substrate is an epitaxial intermediate layer 2 comprising a p-type $Ga_{0.3}Al_{0.7}As$. The exposed surface 6 of the detector layer has been treated to provide a negative electron affinity surface, enabling a high percentage of photoexcited electrons released in the detector layer to escape into the surrounding vacuum 7.

In operation of the devices infra-red radiation 4 falling upon the transparent substrate 1 passes through both substrate 1 and intermediate layer 2 to be absorbed in the detector layer 3 causing the release of electrons. These photoexcited electrons diffuse to the surface 6 and escape into the surrounding vacuum 7 from whence they may be accelerated to a collector or phosphor screen (which are not shown). The electrons so released are indicated by the numeral 5.

One method of manufacture of such a transmission photocathode is illustrated in FIG. 2. The apparatus comprises a carbon boat 10 wherein a carbon slider 16 operates. The length of the slider 16 is somewhat less than the length of the boat 10. Centrally placed in the base of boat 10 is a circular recess 12. The slider 16 has two cylindrical wells 18 and 20, each of the same diameter as the boat recess 12. Initially the slider 16 is placed at one end of the boat 10 such that neither well overlaps the recess 12.

A suitable gallium phosphide seed crystal 14 is chemically cleaned and placed in recess 12.

Two solutions 22 and 24 are prepared as follows:

solution 22:10g gallium, 1g gallium arsenide, 80 mg aluminum, 0.1g zinc.

solution 24:10g gallium, 0.8g gallium arsenide, 0.3g zinc

These solutions are placed in the wells 18 and 20, solution 22 in well 18 nearer seed crystal 14, solution 24 in well 20 further from seed crystal 14. The system is assembled and loaded into a single zone furnace.

Initially the system is flushed for 30 minutes with pure hydrogen. The furnace is then raised to 1000°C, then after 10 minutes taken down to 950°C and left for 20 minutes to stabilize. The system is then programmed to cool at the rate of about 80°C/hour and the slide 16 moved within carbon boat 10 to bring well 18 directly above recess 12 and solution 22 into contact with the GaP seed crystal 14. Growth of the intermediate layer commences. After an hour slide 16 is again moved to bring well 20 above recess 12 and solution 24 into contact with the deposited p-type $Ga_{0.3}Al_{0.7}As$ intermediate layer on seed crystal 14. Growth of the p-type gallium arsenide layer commences. The growth continues for a few minutes, the actual period depending on the thickness of p-type gallium arsenide required, before the solution 24 is swept off and the furnace turned off.

The photocathode thus prepared is heat cleaned in a vacuum, then exposed alternately to caesium vapour and oxygen until its surface has the correct electron emission properties. This part of the process is identical to that carried out on prior art photocathodes.

While the production of transmission photocathodes according to the invention has been described with reference to a horizontal liquid epitaxial system, their manufacture is not limited to this system, for example a vertical liquid epitaxial system or a vapour deposition system might be used to grow the layers.

The present invention overcomes the fundamental problem of lattice mismatch between the p-type GaAs layer and the GaP substrate by introducing another layer between the GaP substrate and the p-type GaAs epitaxial layer. Study of mixed group III-V alloy systems show that the alloy $Ga_{1-x}Al_xAs$ has an almost constant lattice parameter from $x = 0$ (pure GaAs, lattice constant 5.65A); to $x = 1$ (pure AlAs, lattice constant 5.66A). Since the energy gap of $Ga_{(1-x)}Al_xAs$ varies from 1.4eV at $x = 0$ to 2.1eV at $x = 1$, as shown in FIG. 3, it is possible to choose a composition which is both transparent over an appreciable spectral range and which matches the GaAs lattice parameter. Where a device is required which will detect a wide spectral range, values of $x$ giving an indirect energy band gap are preferred. Values of $x$ below 0.4 give material with a direct energy band gap which has much increased absorption but will provide a device with a narrower spectral window. It will be appreciated that in FIG. 3 the atom fraction of As in $Ga_xAl_{(1-x)}As$ is fixed.

While the invention has been particularly described with reference to a zinc doped p-type gallium arsenide photocathode with a gallium phosphide substrate, it is emphasized that the invention is of much wider scope than this narrow interpretation. There are many other p-type dopants which might be used; in particular it has been stated that germanium, silicon or cadmium are suitable. Other p-type group III-V compound photocathodic layers may be used for the detector layer, as may other p-type alloys selected from the group III-V mixed alloy systems for the intermediate layer. It will be remembered that p-type $Ga_{0.5}In_{0.5}P$ was specifically mentioned as an alternative to p-type $Ga_{(1-x)}Al_xAs$ when p-type GaAs is the detector.

By reference to FIG. 4 the instructed reader can ascertain a suitable material for the intermediate layer matching a particular detector layer. Taking as a first example p-type gallium arsenide as a detector, reference to FIG. 4 shows that $Ga_{1-x}Al_xAs$ provides a suitable intermediate layer as does $Ga_{0.5}In_{0.5}P$. As a further example the photodetector material p-type $Ga_{0.8}In_{0.2}As$ having a lattice constant of slightly over 5.7A can be matched by p-type $Ga_{0.3}In_{0.7}P$ as the intermediate layer. Similarly the photodetector material p-type Ga $As_{0.8}Sb_{0.2}$ can also be matched by p-type $Ga_{0.3}In_{0.7}P$.

We claim:

1. A transmission photocathode comprising:

an activated detector layer of p-type gallium arsenide of thickness less than the electron diffusion length in gallium arsenide, a crystalline substrate of gallium phosphide having an energy band gap greater than that of said gallium arsenide detector layer, and a p-type intermediate layer selected from the group consisting of $Ga_{(1-x)}Al_xAs$, where $0 < x \leqslant 1$, and $Ga_{0.5}In_{0.5}P$, said detector layer being epitaxially supported upon said intermediate layer, and said intermediate layer being supported upon said substrate.

2. The transmission photocathode of claim 1 wherein $0.4 \leqslant x \leqslant 1$.

3. The transmission photocathode of claim 2 wherein $x = 0.7$.

4. A transmission photocathode comprising:

an activated detector layer of p-type photocathodic material having a thickness less than the electron diffusion length in said photocathodic material, said photocathic material being selected from the group consisting of gallium indium arsenide and gallium arsenide antimonide, a crystalline substrate of gallium phosphide having an energy band gap greater than that of the detector layer, and an intermediate layer comprising p-type gallium indium phosphide having a lattice constant within 0.2% of said detector layer and having an energy band gap greater than that of the detector layer, said detector layer being epitaxially supported upon said intermediate layer, and said intermediate layer being supported upon said substrate.

5. A transmission photocathode comprising:

an activated detector layer of p-type gallium arsenide having a thickness less than the electron diffusion length in gallium arsenide, a gallium phosphide substrate, and an intermediate layer comprising $Ga_{0.3}Al_{0.7}As$ including a p-type dopant, said p-type dopant being zinc, said detector layer being epitaxially supported upon said intermediate layer, and said intermediate layer being supported upon said substrate.

6. A transmission photocathode comprising:

an activated detector layer of p-type gallium arsenide having a thickness less than the electron diffusion length in gallium arsenide, a gallium phosphide substrate, and an intermediate layer comprising $Ga_{0.5}In_{0.5}P$ including a p-type dopant, said p-type dopant being zinc, said detector layer being epitaxially supported upon said intermediate layer, and said intermediate layer being supported upon said substrate.

* * * * *